United States Patent
Inotsume et al.

(10) Patent No.: US 7,535,087 B2
(45) Date of Patent: May 19, 2009

(54) SEMICONDUCTOR DEVICE WITH LEAD FRAMES

(75) Inventors: Hideyuki Inotsume, Gunma (JP); Hirokazu Fukuda, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 13 days.

(21) Appl. No.: 11/692,563

(22) Filed: Mar. 28, 2007

(65) Prior Publication Data

US 2007/0228537 A1    Oct. 4, 2007

(30) Foreign Application Priority Data

Mar. 29, 2006    (JP)    ............... 2006-091903

(51) Int. Cl.
    H01L 23/02    (2006.01)
    H01L 23/48    (2006.01)
(52) U.S. Cl. ............... 257/678; 257/E23.042; 257/E23.047; 257/E23.052; 257/E23.124; 257/666; 257/698; 257/684; 257/786; 257/784; 257/796; 257/777; 257/723; 257/686; 257/685
(58) Field of Classification Search ............... 257/678, 257/E23.042, E23.047, E23.052, E23.124, 257/666, 684, 698, 696, 723, 686, 685, 777, 257/784, 786, 796
See application file for complete search history.

(56) References Cited

U.S. PATENT DOCUMENTS

| 6,603,197 | B1 * | 8/2003 | Yoshida et al. ............... 257/676 |
| 6,677,665 | B2 * | 1/2004 | Huang ............... 257/690 |
| 7,012,325 | B2 * | 3/2006 | Ahn et al. ............... 257/678 |
| 2003/0111739 | A1 * | 6/2003 | Kouzuki et al. ............... 257/782 |
| 2005/0110127 | A1 * | 5/2005 | Kanemoto et al. ............... 257/686 |
| 2007/0209834 | A1 * | 9/2007 | Kuan et al. ............... 174/520 |
| 2008/0050859 | A1 * | 2/2008 | Wallace ............... 438/123 |

FOREIGN PATENT DOCUMENTS

JP    2004-172542    6/2004

* cited by examiner

*Primary Examiner*—Alexander O Williams
(74) *Attorney, Agent, or Firm*—Fish & Richardson P.C.

(57) ABSTRACT

By disposing a rear surface of a first island 12 and a top surface of a second island 13 so as to at least partially overlap each other, a first semiconductor chip on the first island and a second semiconductor chip on a rear surface of the second island are configured so as to overlap each other. Accordingly, a planar occupied area can be set smaller than planar areas of both of the chips. Moreover, thin metal wires to be connected to the second semiconductor chip 20 are extended to a back side. Consequently, a thickness of a semiconductor device can also be reduced.

8 Claims, 5 Drawing Sheets

SEMICONDUCTOR DEVICE WITH LEAD FRAMES

Priority is claimed to Japanese Patent Application Number JP2006-091903 filed on Mar. 29, 2006, the disclosures of which are incorporated herein by reference in its entirety.

BACKGROUND OF THE INVENTION

1. Field of the Invention

The present invention relates to a semiconductor device.

2. Description of the Related Art

A semiconductor device using a lead frame generally includes an island, a plurality of leads whose one ends are disposed around the island, and a semiconductor chip provided on the island. Moreover, a bonding pad of the semiconductor chip and the one ends of the leads are connected to each other by use of thin metal wires. This technology is described for instance in Japanese Patent Application Publication No. 2007-5569. Furthermore, the island, the plurality of leads, the semiconductor chip and the plurality of thin metal wires are sealed by an insulating resin so as to expose the other ends of the plurality of leads. Here, in the plurality of leads, portions sealed by the insulating resin are called inner leads, and portions exposed from the insulating resin are called outer leads. By bending the outer leads according to need, the other ends of the leads are mounted on a printed board or the like by use of solder and the like.

Moreover, a stack type semiconductor device is also realized, which is formed by stacking a plurality of chips on an island. In this semiconductor device, a child chip smaller than a parent chip is stacked on the parent chip, and both of the parent chip and the child chip are electrically connected by use of thin metal wires.

The semiconductor device as described above can be miniaturized by a recent high technology. However, a surface of the child chip is disposed at a position higher than that of a surface of the parent chip from a surface of the island. Accordingly, when the child chip is further connected by use of the thin metal wire, a top of the thin metal wire is positioned higher. Consequently, there is a problem that a thickness of the semiconductor device, in other words, a thickness of a package is increased.

SUMMARY OF THE INVENTION

For this reason, it is an object of the present invention to realize a semiconductor device which can mount a plurality of chips thereon without increasing a thickness of a package.

Main characteristics of the present invention are as follows.

Specifically, first, a semiconductor device of the present invention includes a first island, a plurality of first leads each having one end disposed near the first island, a first semiconductor chip which is provided on an upper surface of the first island and electrically connected to the first leads, a second island, a plurality of second leads each having one end disposed near the second island, and a second semiconductor chip which is provided on a rear surface of the second island and electrically connected to the second leads. In the semiconductor device, a rear surface of the first island and a top surface of the second island are disposed so as to at least partially overlap each other. Moreover, the first island, the second island, a part of the first leads and a part of the second leads are sealed by an insulating resin.

Secondly, a semiconductor device of the present invention includes a first island, a plurality of first leads having first bonding parts provided near the first island, a first semiconductor chip which is provided on an upper surface of the first island and electrically connected to the first bonding parts, a second island, a plurality of second leads a having second bonding part provided near the second island, and a second semiconductor chip which is provided on a rear surface of the second island and electrically connected to the second bonding parts. In the semiconductor device, the second lead is disposed between a pair of the adjacent first leads, a rear surface of the first lead and a top surface of the second lead are disposed so as to at least partially overlap each other, and the first island, the second island, a part of the first leads and a part of the second leads are sealed by an insulating resin.

Third, a semiconductor device of the present invention includes a first island, a plurality of first leads each having one end disposed near the first island, a first semiconductor chip which is provided on an upper surface of the first island and electrically connected to the first leads, a second island, a plurality of second leads each having one end disposed near the second island, and a second semiconductor chip which is provided on a rear surface of the second island and electrically connected to the second leads. In the semiconductor device, a rear surface of the first island and a top surface of the second island are disposed so as to at least partially overlap each other, and the second leads is disposed between a pair of first leads. Moreover, a rear surface of the first lead and a top surface of the second lead are disposed so as to at least partially overlap each other, and the first island, the second island, a part of the first leads and a part of the second leads are sealed by an insulating resin.

Fourth, the first island and the second island has a pair of sides opposite to each other. The first lead integrated with a pad is extended on one of the sides of the first island, and a first suspension lead integrated with the first island is provided on the other side. The second lead integrated with a pad is extended on one of the sides of the second island, and a second suspension lead integrated with the second island is provided on the other side.

Fifth, the first island and the second island has a pair of sides opposite to each other The first lead integrated with a pad is extended on one of the sides of the first island, and the first suspension lead integrated with the first island is provided on the other side. The second suspension lead integrated with the second island is provided on one of the sides of the second island, and the second lead integrated with a pad is extended on the other side.

Furthermore, a semiconductor device of the present invention includes a first island, first leads each having one end disposed near the first island, a first semiconductor chip which is fixed on an upper surface of the first island and electrically connected to the first leads, a second island, second leads each having one end disposed near the second island, and a second semiconductor chip which is fixed on a lower surface of the second island and electrically connected to the second leads. In the semiconductor device, the first and second islands are disposed at planarly different positions so as to be partially shifted from each other in a thickness direction.

DESCRIPTION OF THE EMBODIMENTS

Figure 1:
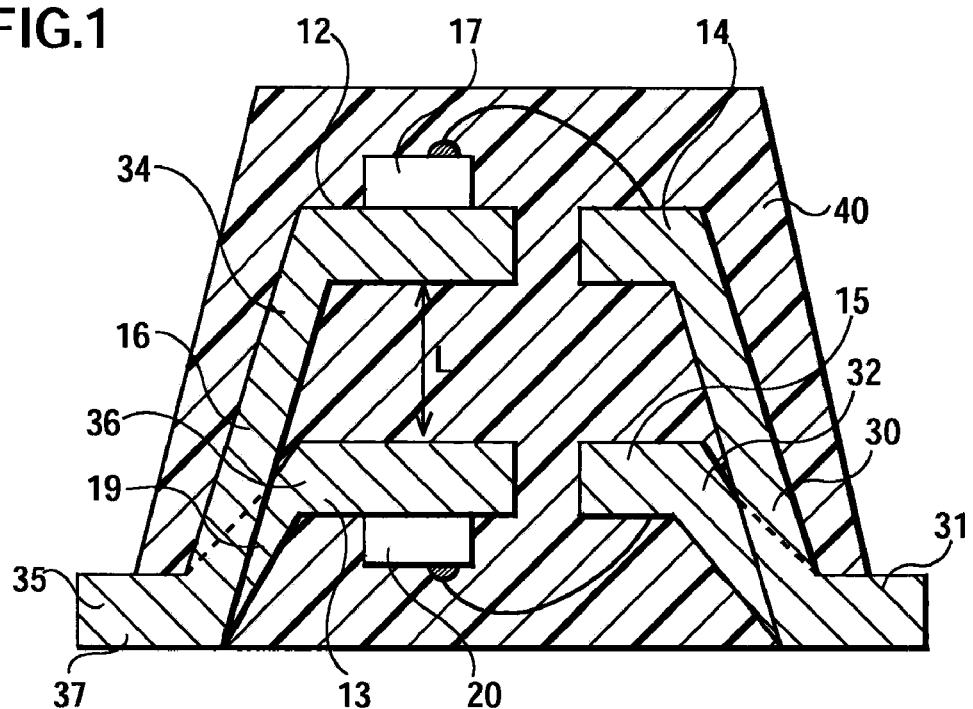
FIG. 1 is a cross-sectional view showing a semiconductor device in preferred embodiments of the present invention.
Figure 2:
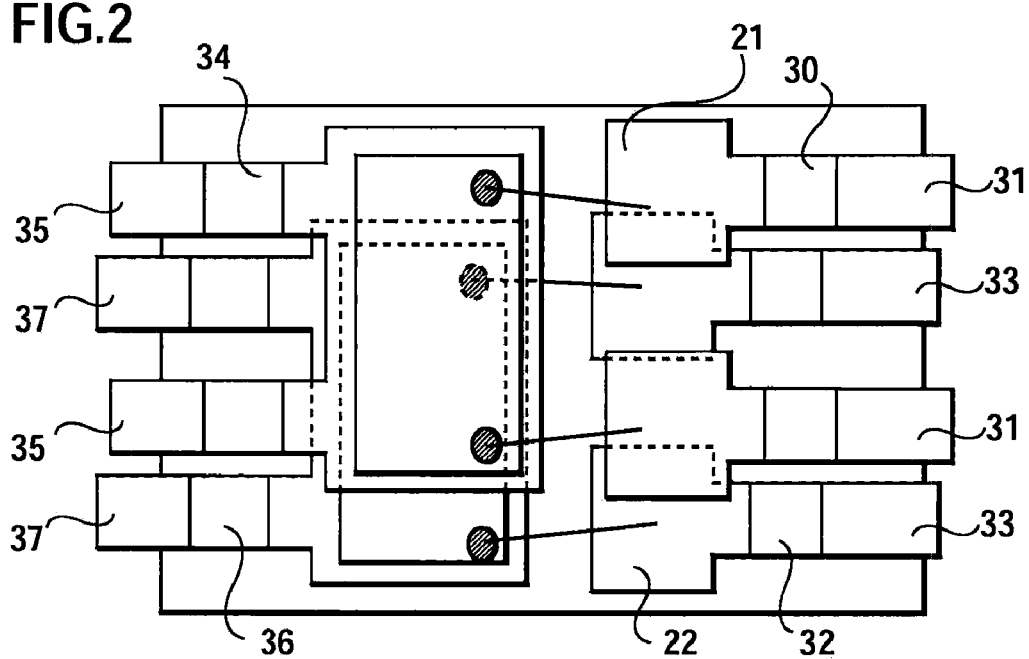
FIG. 2 is a plan view showing the semiconductor device in the preferred embodiments of the present invention.

With reference to the drawings, preferred embodiments of the present invention will be described. FIG. 1 is a cross-sectional view of a semiconductor device. FIG. 2 is a plan view of the semiconductor device. Moreover, FIGS. 3 and 4 are exploded views of the semiconductor device.

First, before the semiconductor device in each of preferred embodiments of the present invention shown in FIGS. 1 and 2 will be explained, description will be given with reference to FIGS. 3 and 4. In the embodiments, the semiconductor device, to be brief, has a configuration in which a first lead frame 10 shown in FIG. 3 and a second lead frame 11 shown in FIG. 4 are laminated. For example, a first island 12 in the first lead frame 10 and a second island 13 in the second lead frame 11 at least partially overlap each other. Moreover, to put it another way, a first lead 14 in the first lead frame 10 and a second lead 15 in the second lead frame 11 at least partially overlap each other.

Figure 3:
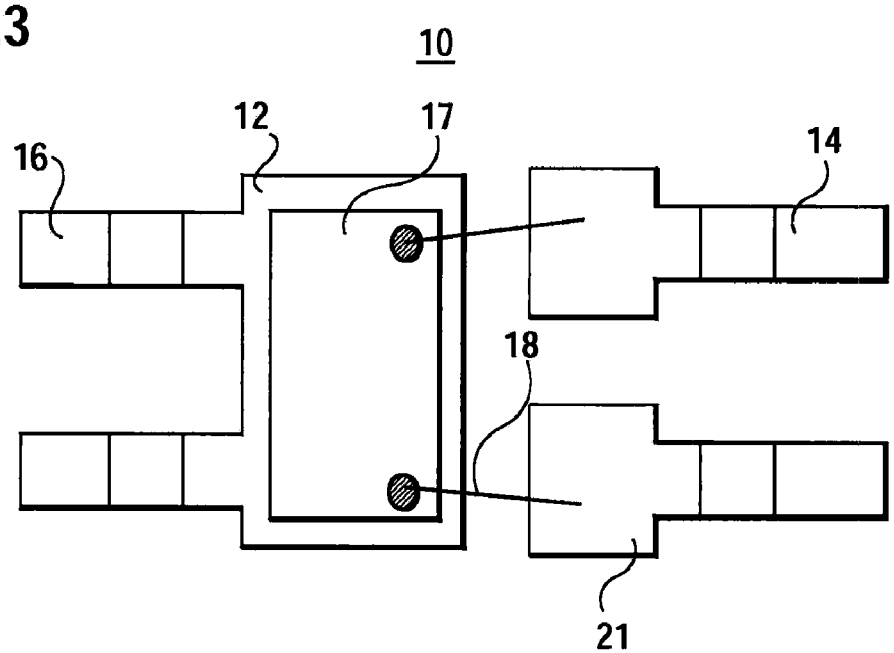
FIG. 3 is a diagram showing a first lead frame adopted in the semiconductor device in the preferred embodiments of the present invention.
Figure 4:
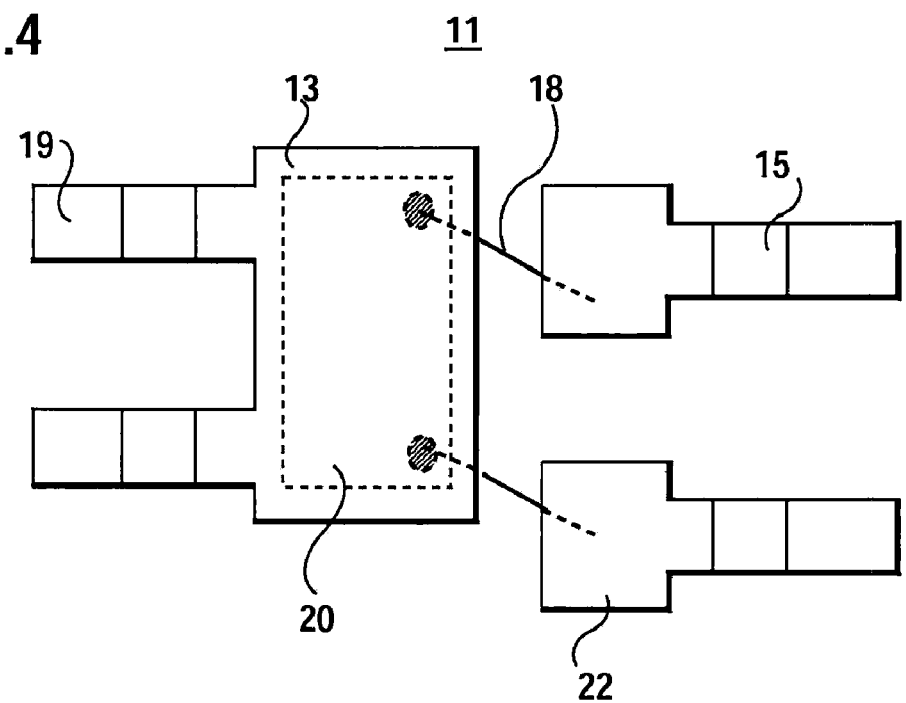
FIG. 4 is a diagram showing a second lead frame adopted in the semiconductor device in the preferred embodiments of the present invention.

Now, with reference to FIG. 3, the first lead frame 10 will be specifically described. First, the first lead frame 10 includes: the first island 12; at least one lead 16 (here, two) which has one end integrated with the first island 12 and has the other end extended to the left; and at least one first lead 14 (here, two) which is positioned near the first island 12, has one end set close to a right side of the island and has the other end extended to the right. Here, the leads are extended on both sides of the first island 12, two on each side. Moreover, the one end of the first lead 14 is processed to have a rectangular shape and is used as a first bonding part 21.

Furthermore, a first semiconductor chip 17 is provided on a surface of the first island 12. Moreover, electrodes (portions indicated by shaded circles in FIG. 3) formed on an upper surface of the first semiconductor chip 17 and the first bonding parts 21 of the first leads 14 are electrically connected to each other. Although, here, thin metal wires 18 are adopted, metal plates or the like can be used for the electrical connection.

Meanwhile, with reference to FIG. 4, the second lead frame 11 will be described. A basic shape of the second lead frame 11 is the same as that of the first lead frame 10. The second lead frame 11 includes: the second island 13; at least one lead 19 which has one end integrated with the second island 13 and has the other end extended to the left; and at least one second lead 15 which is positioned near the second island 13, has one end set close to a right side of the island and has the other end extended to the right. Here, the leads are extended on both sides of the second island 13, two on each side. Furthermore, a second semiconductor chip 20 is provided on a rear surface of the second island 13. Moreover, electrodes (portions indicated by shaded circles in FIG. 4) on the second semiconductor chip 20 and second bonding parts 22 of the second leads 15 are electrically connected to each other. Although, here, thin metal wires 18 are adopted, metal plates or the like can be used for the electrical connection. Moreover, the one end of the second lead 15 is processed to have a rectangular shape and is used as the second bonding part 22.

First Embodiment

Now, with reference to FIGS. 1 and 2, a first embodiment will be specifically described. A semiconductor device of this embodiment has a structure in which the first and second lead frames 10 and 11 described with reference to FIGS. 3 and 4 partially overlap each other. Specifically, an island positioned on an upper side in FIG. 1 corresponds to the first island 12 shown in FIG. 3, and an island positioned on a lower side in FIG. 1 corresponds to the second island 13 shown in FIG. 4. Here, since electrical insulation between the first and second islands 12 and 13 is required, the islands are separated from each other by a distance L.

This separation distance L is required to be at least about 50 μm. A conventional semiconductor device has a structure in which the lead frames shown in FIGS. 3 and 4 are disposed side by side as they are. Accordingly, an area obtained by directly adding areas of the first and second islands 12 and 13 is required for mounting. On the other hand, in the first embodiment, as shown in FIG. 2, a rear surface of the first island 12 and a top surface of the second island 13 at least partially overlap each other. For this reason, an area occupied by the islands from a planar point of view can also be reduced.

Meanwhile, a rear surface of the first lead 14 and a top surface of the second lead 15 are separated from each other by at least about 50 μm, as in the case of the islands. Moreover, with reference to FIGS. 1 and 2, the first and second leads 14 and 15 are formed as described below. Specifically, a first slope part 30 is provided obliquely downward from the first bonding part 21, and a first connection part 31 is horizontally provided at a tip of the slope part 30. Moreover, a second slope part 32 is provided obliquely downward from the second bonding part 22, and a second connection part 33 is horizontally provided at a tip of the slope part 32.

Moreover, the leads 16 and 19 are similarly formed. Specifically, a slope part 34 is provided obliquely downward from the lead integrated with the first island 12, and a connection part 35 is provided at a tip of the slope part 34. Furthermore, a slope part 36 is provided obliquely downward from the lead 19 integrated with the second island 13, and a connection part 37 is provided at a tip of the slope part 36.

As described above, in the first embodiment, the first and second islands 12 and 13 are separated from each other by the distance L. Moreover, the first and second bonding parts 21 and 22 are provided so as to be separated from each other by the distance L or by a distance near the separation distance. Furthermore, the slope parts and connection parts extended from the bonding parts and the slope parts and connection parts extended to the left from the first and second islands 12 and 13 can be disposed so as not to come into contact with each other.

In addition, the first and second lead frames 10 and 11 are sealed by an insulating resin 40. Moreover, rear surfaces of the connection parts 31, 33, 35 and 37 are exposed on a rear surface of the insulating resin 40.

As described above, the rear surface of the first island 12 and the top surface of the second island 13 are vertically separated from each other by L. Moreover, the first and second islands 12 and 13 at least partially overlap each other. For this reason, the area occupied by the islands from a planar point of view can be reduced. In addition, the slope part in the second island 13 is extended obliquely downward, and the second semiconductor chip 20 and thin metal wires can be disposed on the extended portion. Consequently, it is no longer required to additionally increase a thickness corresponding thereto. As a result, a thickness of the semiconductor device can also be reduced.

Second Embodiment

Subsequently, a second embodiment will be described. In the previous embodiment, the description was given of only overlapping of the islands. Meanwhile, in this embodiment, first bonding parts 21 and second bonding parts 22 also overlap each other.

Since the bonding part (bonding post) is generally connected by use of a thin metal wire, a head of a bonding tool has to come into contact therewith. Accordingly, at least a predetermined distance is required between two adjacent bonding parts. However, in a semiconductor device of this embodiment, for example, the first bonding part 21 and the second bonding part 22 adjacent thereto are in a front-and-back relationship, so that, here, a distance between the first and second bonding parts can be set shorter than the predetermined distance. Consequently, the first and second bonding parts 21 and 22 can at least partially overlap each other. In this embodiment, each of second leads 15 is disposed around a center portion between first leads 14.

The second embodiment will be specifically described with reference to FIG. 3. A width of the first lead 14 is about 0.1 mm, and a size (width) of the first bonding part 21 is 0.2 to 0.25 mm. Accordingly, for example, when a width of one side of the first bonding part 21 is 0.25 mm, an end of the first bonding part 21 protrudes by 0.125 mm from a center of the first lead 14, in other words, protrudes by 0.075 mm from upper and lower sides of the first lead 14. Moreover, a distance between the first leads 14 is 0.25 mm, and a distance between the lower side of the first bonding part 21 and an upper side of a bonding part adjacent thereto is 0.1 mm. The same goes for FIG. 4.

For this reason, back to FIG. 1, the lead frames shown in FIGS. 3 and 4 are laminated as described below. Specifically, the second lead 15 is disposed between the two first leads 14. Accordingly, the first and second bonding parts 21 and 22 are disposed so as to partially overlap each other.

As described above, the second embodiment is different from the previous embodiment only in the point that the bonding parts overlap each other. Since the second embodiment is the same as the first embodiment in the other points, description thereof will be omitted below.

Third Embodiment

Figure 5:
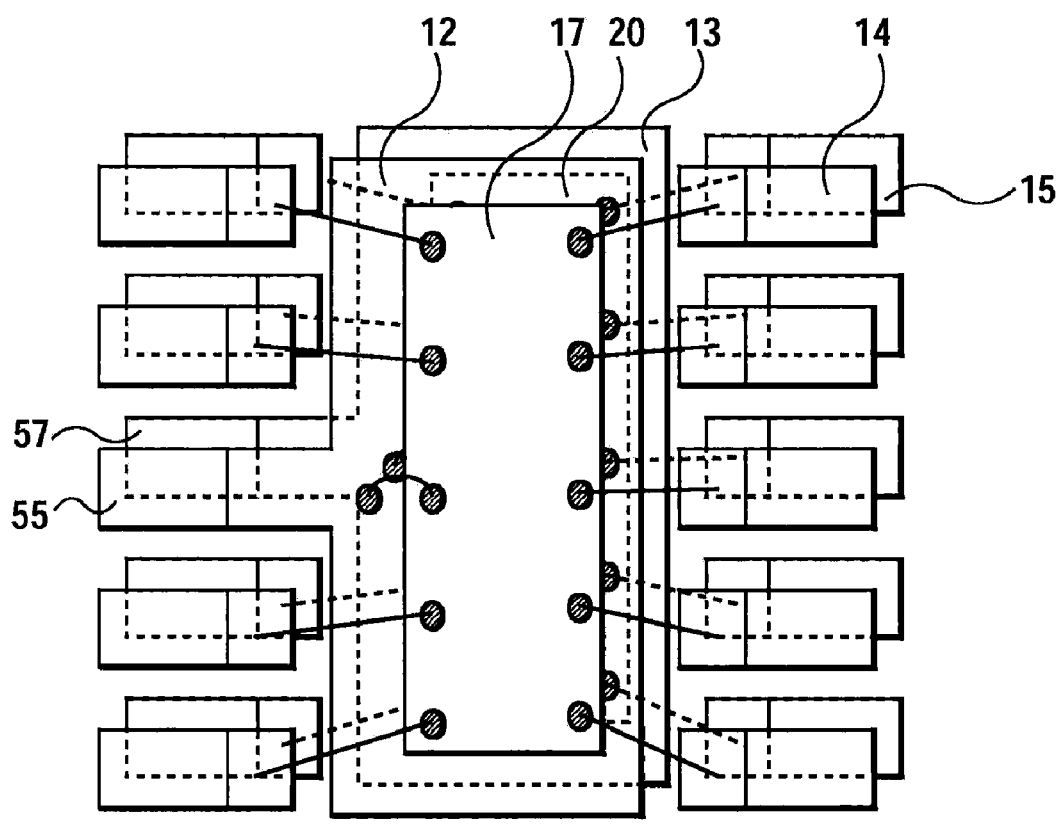
FIG. 5 is a plan view showing a semiconductor device in another preferred embodiment of the present invention.
Figure 6:
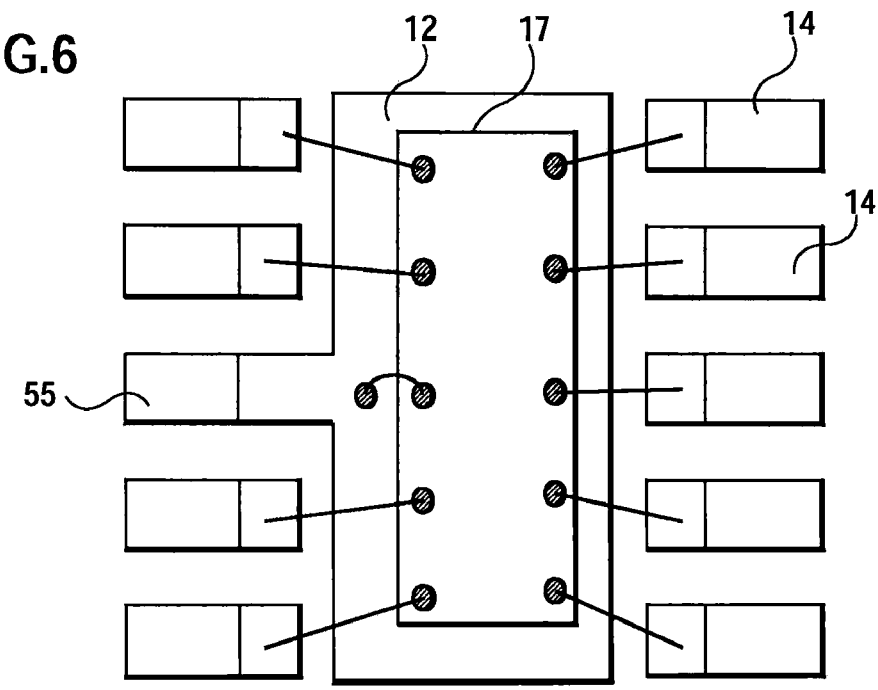
FIG. 6 is a diagram showing a first lead frame adopted in the semiconductor device in another preferred embodiment of the present invention.
Figure 7:
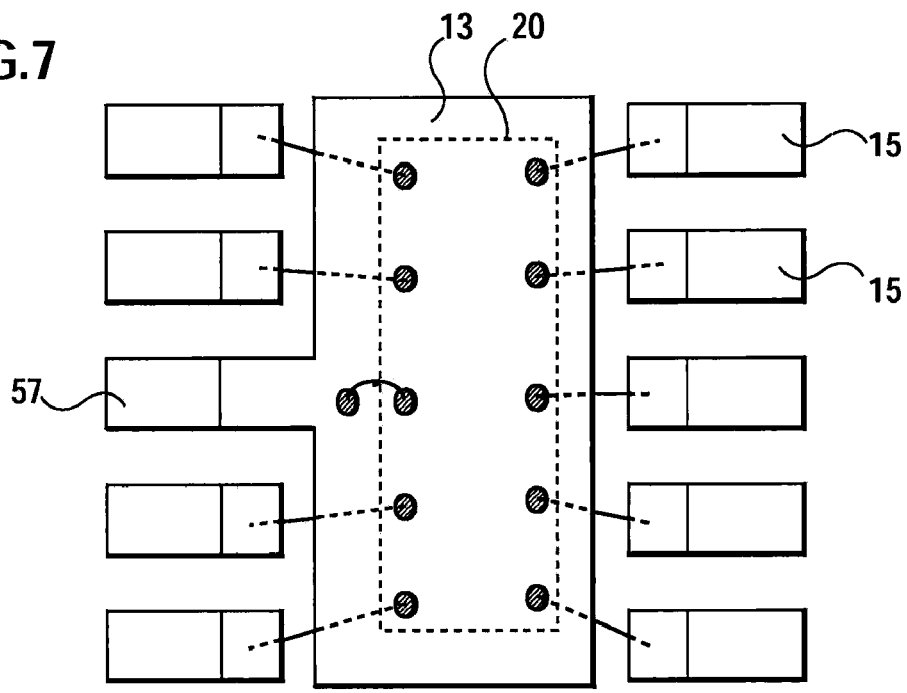
FIG. 7 is a diagram showing a second lead frame adopted in the semiconductor device in another preferred embodiment of the present invention.

With reference to FIGS. 5 to 7, this embodiment will be described below. FIG. 5 is a plan view showing a semiconductor device of this embodiment. FIG. 6 is a plan view showing a first lead frame extracted from the semiconductor device. FIG. 7 is a plan view showing a second lead frame extracted from the semiconductor device.

In the embodiments described above, the built-in elements are discrete type transistors. Meanwhile, in this embodiment, an IC having a number of electrodes formed therein is built into the semiconductor device. Accordingly, in this embodiment, lead frames to be used are IC lead frames. Specifically, on the lead frames shown in FIGS. 6 and 7, semiconductor chips having a number of bonding pads thereon are mounted. Accordingly, a number of leads corresponding to the number of the bonding pads are included in the lead frames.

With reference to FIG. 5, the lead frames having a number of leads are laminated. As in the case of the previous embodiment, a first semiconductor chip 17 is mounted on a surface of a first island 12 and is connected to first leads 14 by use of thin metal wires. Moreover, a second semiconductor chip 20 is mounted on a rear surface of a second island 13 and is electrically connected to second leads 15 by use of thin metal wires. Each of the second leads 15 is disposed between the first leads 14. Moreover, parts denoted by reference numerals 55 and 57 are suspension leads extended to the outside so as to be continuous with the respective islands. The suspension leads have a function of mechanically supporting the respective islands in the middle of manufacturing steps.

Moreover, here, an insulating resin 40 is provided but is not shown in FIG. 5.

As is clear from FIG. 5, a surface of the first island 12 and a rear surface of the second island 13 at least partially overlap each other, so that a planar area occupied by the islands can be reduced.

Furthermore, connection points of the leads to the thin metal wires are alternately positioned between a front and a back so that as in the case of the previous embodiment, the leads can partially overlap each other.

Although not shown in the drawings, slope parts and bonding parts are extended obliquely downward in the respective leads, so that the second semiconductor chip 20 and the thin metal wires connected thereto are provided in a space defined by those parts. Accordingly, a thickness can also be reduced.

Here, in FIG. 5, the two suspension leads extended integrally from both of the islands are extended to the outside from the respective sides (left sides on the page space). Here, the suspension lead extended to the outside from one of the islands can be provided on the left side and the suspension lead extended to the outside from the other island can be provided on the right side.

Fourth Embodiment

Figure 8A:
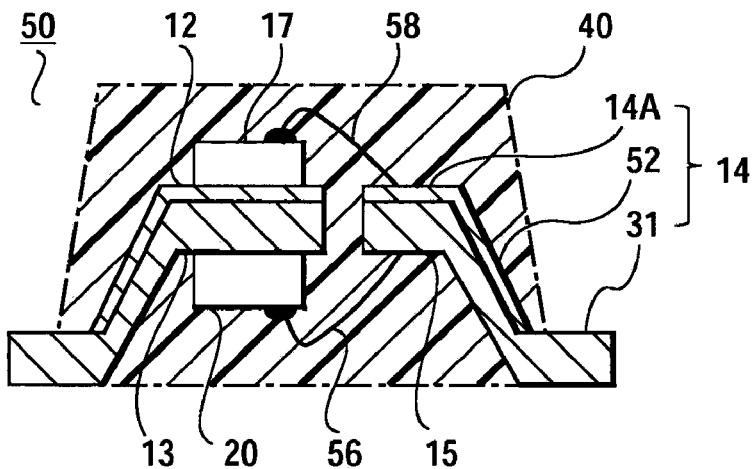
FIG. 8A is a cross-sectional view.
Figure 8B:
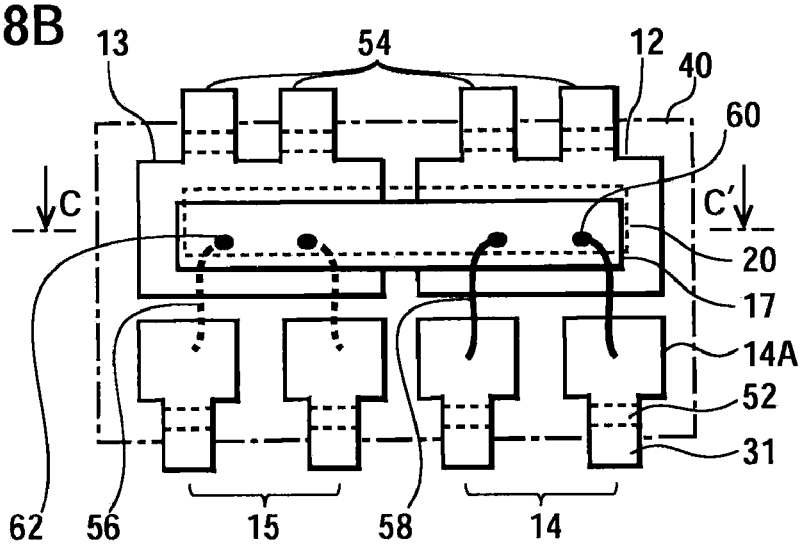
FIG. 8B is a plan view and FIG. 8C is a cross-sectional view showing the semiconductor device in still another preferred embodiment of the present invention.
Figure 8C:
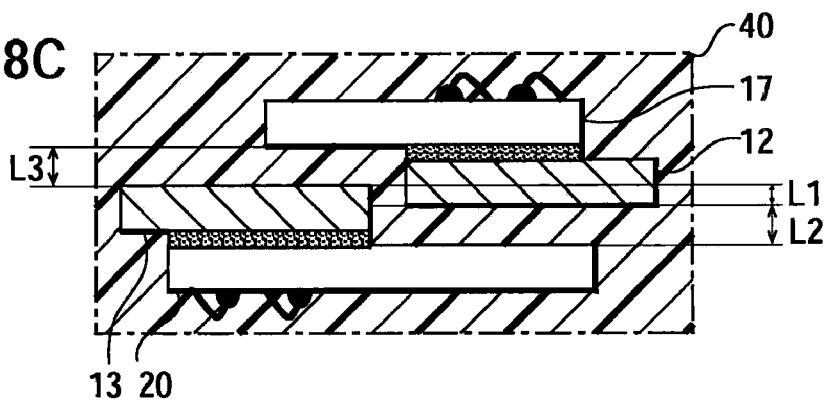

With reference to FIGS. 8A to 8C, a configuration of a semiconductor device 50 of this embodiment will be described. FIG. 8A is a cross-sectional view of the semiconductor device 50. FIG. 8B is a plan view of the semiconductor device 50 shown in FIG. 8A when seen from above. FIG. 8C is a cross-sectional view taken along the line C-C' in FIG. 8B. In this embodiment, the same parts as those in the other embodiments described above are denoted by the same reference numerals, and description thereof will be omitted.

The configuration of the semiconductor device 50 is basically the same as that of the semiconductor device shown in FIG. 1, The semiconductor device 50 is different from that shown in FIG. 1 in that a first island 12 and a second island 13 are disposed at planarly different positions (see FIG. 8B). In other words, the first and second islands 12 and 13 are not disposed so as to planarly overlap each other. Moreover, with reference to FIG. 8C, the first and second islands 12 and 13 are shifted from each other in a thickness direction and disposed so as to at least partially overlap each other. Here, the disposition of the islands at the planarly different positions means that the islands do not planarly overlap each other in the disposition shown in FIG. 8B. Furthermore, overlapping in the thickness direction means that the islands overlap each other in a vertical direction on the page space with reference to FIG. 8C.

Moreover, a positional relationship in the thickness direction between the first and second islands 12 and 13 will be described. Both of the islands are not disposed on the same plane. Accordingly, with reference to FIG. 8C, an upper surface of the first island 12 and a lower surface of the second island 13 protrude in the thickness direction.

With reference to FIG. 8A, the configuration of the semiconductor device 50 will be described. The semiconductor device 50 is formed by resin-sealing a plurality of semiconductor chips. In terms of its external appearance, the semiconductor device 50 has an approximately cubic shape or an approximately rectangular parallelepiped shape. Moreover, upper and lower surfaces thereof are flat surfaces parallel to each other, and side faces thereof are tilted surfaces, each having its upper part tilted inward than its lower part. Furthermore, a connection part 31 formed of an end of a lead electrically connected to built-in semiconductor chips is extended to the outside from the lower part of a side face of an insulating resin 40 which integrally seals the entire device. Moreover, a lower surface of the connection part 31 and a lower surface of the insulating resin 40 are positioned on the same plane. The semiconductor device 50 can be packaged by a reflow step of heating and melting solder cream applied to the connection part 31.

As to a specific structure of the semiconductor device 50, first, a plurality of semiconductor elements (a first semiconductor chip 17 and a second semiconductor chip 20) are built into the device so as to overlap each other. With reference to FIGS. 8A and 8B, the first semiconductor chip 17 is fixed to the upper surface of the first island 12, and the second semiconductor chip 20 is fixed to the lower surface of the second island 13. For this reason, the first and second semiconductor chips 17 and 20 are disposed so as to face opposite directions in the thickness direction of the semiconductor device 50.

With reference to FIG. 8A, the first semiconductor chip 17 fixed to the upper surface of the first island 12 is connected to an upper surface of a bonding part 14A of a first lead 14 through a thin metal wire 58. Furthermore, the second semiconductor chip 20 fixed to the lower surface of the second island 13 is connected to a lower surface of a bonding part of a second lead 15 through a thin metal wire 56. Here, the first and second leads 14 and 15 can be disposed so as to partially overlap each other. Accordingly, a planar area of the semiconductor device 50 can be reduced.

With reference to FIG. 8B, the first semiconductor chip provided on the upper surface of the first island 12 is disposed not only on the first island 12 but also over the second island 13 adjacent thereto. Accordingly, without being limited by a size of the first island 12, a large first semiconductor chip 17 can be disposed. Here, the first semiconductor chip 17 has a rectangular shape having long sides in a lateral direction (a direction in which the islands are aligned). Furthermore, the same goes for the second semiconductor chip 20. The second semiconductor chip 20 fixed to the lower surface of the second island 13 is disposed so as to overlap the second island 13 as well as the first island 12. Here, both of the semiconductor chips do not have to be disposed over the two islands. Only either one of the semiconductor chips can be disposed over both of the islands.

Furthermore, with reference to FIG. 8A, the first lead 14 includes: the bonding part 14A having the upper surface connected to the thin metal wire 58; a connection part 52 which is continuous with the bonding part 14A and is tilted outward and downward; and the connection part 31 which is exposed to the outside from the insulating resin 40 and has the lower surface positioned on the same plane as the lower surface of the insulating resin 40. Although the second lead 15 also has the same configuration, the thin metal wire is connected to the lower surface of the bonding part in the second lead 15.

In addition, with reference to FIG. 8B, two leads 54 extended to the outside from the first island 12 are provided, and another two leads 54 extended to the outside from the second island 13 are also provided. On the page space, the leads 54 extended from the upper side of the insulating resin 40 and the first and second leads 14 and 15 extended to the outside from the lower side thereof are arranged in a vertically symmetrical manner. Accordingly, a packaging property of the semiconductor device 50 in the reflow step can be improved.

With reference to FIG. 8C, the first and second islands 12 and 13 are disposed so as to be shifted from each other in the thickness direction and to partially overlap each other in the thickness direction. Here, the first island 12 is disposed slightly closer to the upper side within the insulating resin 40. Meanwhile, the second island 13 is disposed closer to the lower side compared with the first island 12. Here, both of the islands can partially overlap each other or can not at all overlap each other.

Here, as an example, a thickness of each of the first and second islands 12 and 13 is, for example, about 0.5 mm. In addition, a thickness L1 of overlapping thereof is smaller than the thickness of the islands and is, for example, about 0.2 mm. Moreover, a distance L2 between the lower surface of the first island 12 and the upper surface of the second semiconductor chip 20 is about 0.3 mm. Furthermore, a distance L3 between the lower surface of the first semiconductor chip 17 and the upper surface of the second island 13 is about 0.3 mm.

By allowing the first and second islands 12 and 13 to partially overlap each other in the thickness direction, the thickness of the semiconductor device 50 can be reduced, and insulation between the islands and the semiconductor chips can be secured. For example, compared with the case where two semiconductor chips are mounted on upper and lower principal surfaces of one island, the thickness of the semiconductor device 50 is reduced by the length (L1) of overlapping between the islands in the thickness direction.

Moreover, the first semiconductor chip 17 is disposed on the upper surface of the first island 12, and the rear surface and side faces thereof are covered with the insulating resin 40 which seals the entire device. Furthermore, the second semiconductor chip 20 is fixed to the lower surface of the second island 13, and the upper surface and side faces thereof are covered with the insulating resin 40. In addition, by disposing the first and second islands 12 and 13 so as to be shifted from each other, the first island 12 and the second semiconductor chip 20 are separated from each other, and the second island 13 and the first semiconductor chip 17 are separated from each other. Consequently, it is possible to prevent short-circuiting between the semiconductor chips and the islands even if relatively large semiconductor chips are laminated and built into the small semiconductor device 50.

Furthermore, in this embodiment, a space between the lower surface of the first island 12 and the upper surface of the second semiconductor chip 20 and a space between the upper surface of the second island 13 and the lower surface of the first semiconductor chip 17 are filled with the insulating resin 40. Here, if it is difficult to fill the spaces with the insulating resin 40 containing fillers, the spaces can be filled with a resin material having an excellent fluidity (for example, a resin having a relatively small filler content) prior to a resin sealing step. Moreover, the spaces can be filled with an adhesive made of an epoxy resin and the like.

With reference to FIG. 8A, the first semiconductor chip 17 is, for example, a MOSFET. A gate electrode and a source electrode are provided on the upper surface thereof, and the rear surface thereof is set to be a drain electrode. Moreover, the electrodes (the gate electrode and the source electrode) on the upper surface are individually connected to the first leads 14 through the thin metal wires 58, and the rear surface is fixed to the upper surface of the first island 12. Meanwhile, the second semiconductor chip 20 is, for example, a MOSFET. A drain electrode on the upper surface thereof on the page space is fixed to the lower surface of the second island 13. Furthermore, electrodes on the lower surface of the second semiconductor chip 20 are connected to the lower surfaces of the bonding parts of the second leads 15 through the thin metal wires 56. Moreover, if the rear surfaces of the semiconductor chips transmit currents therethrough, the semiconductor chips are fixed to the principal surfaces of the islands, on which the respective semiconductor chips are mounted, by use of a conductive adhesive or by eutectic bonding. In addition, if the rear surfaces of the semiconductor chips are not required to be conductive, the semiconductor chips can be mounted on the islands by use of an insulating adhesive.

With reference to FIG. 8B, in this embodiment, bonding pads (electrodes) on the semiconductor chips are provided so as to overlap the islands on which the semiconductor chips are mounted. Specifically, an electrode 60 (a spot where the thin metal wire 58 is connected) on the first semiconductor chip 17 is positioned within the first island 12 from a planar point of view. Accordingly, even if bonding energy (pressing force, vibration force and heat) is applied to the electrode 60 by a bonding tool when the thin metal wire 58 is formed, the first semiconductor chip 17 in this portion is strongly supported by the first island 12. For this reason, the first semiconductor chip 17 can be prevented from being destroyed by the bonding energy applied by the bonding tool. The same goes for the second semiconductor chip 20. An electrode 62 provided on the second semiconductor chip 20 is provided so as to overlap the second island 13.

As a method for laminating a plurality of semiconductor chips inside a semiconductor device, there is a method for laminating two semiconductor chips back to back on both of upper and lower surfaces of one island. However, this method has a risk that the laminated semiconductor chips are short-circuited through the island if rear surfaces of the semiconductor chips are required to be conductive. Meanwhile, in this embodiment, with reference to FIG. 8C, the two islands separated from each other are provided and are disposed so as to be shifted from each other in the thickness direction. Accordingly, the rear surface of one of the islands, through which the current passes, can be insulated from the semiconductor chip mounted on the other island.

Furthermore, in general, when two semiconductor chips are built into a semiconductor device, the respective semiconductor chips are mounted on separate islands and the chips and the islands are laminated. Accordingly, since the two islands and the two semiconductor chips are laminated in a thickness direction, an increase in the thickness due to lamination is unavoidable. Meanwhile, in this embodiment, with reference to FIG. 8C, the first and second islands 12 and 13, on which the respective semiconductor chips are fixed, are set to overlap each other in the thickness direction. For this reason, a package thickness can be reduced by suppressing an increase in the thickness due to lamination of the semiconductor chips.

In the preferred embodiments of the present invention, the rear surface of the first island and the top surface of the second island are disposed so as to at least partially overlap each other. Accordingly, the first semiconductor chip on the first island and the second semiconductor chip on the rear surface of the second island are formed so as to overlap each other.

Consequently, a planar occupied area can be reduced to be smaller than plane areas of both of the chips. Moreover, since thin metal wires connected to the second semiconductor chip are extended to a rear side, a thickness of the semiconductor device can also be reduced.

What is claimed is:

1. A semiconductor device comprising:
a first island;
a plurality of first leads each having one end near the first island;
a first semiconductor chip which is on an upper surface of the first island and electrically connected to the first leads;
a second island;
a plurality of second leads each having one end near the second island; and
a second semiconductor chip which is on a rear surface of the second island and electrically connected to the second leads, wherein
a rear surface of the first island and an upper surface of the second island at least partially overlap each other, and
the first island, the second island, a part of the first leads and a part of the second leads are sealed by an insulating resin.

2. A semiconductor device comprising:
a first island;
a plurality of first leads each having a first bonding part near the first island;
a first semiconductor chip which is on an upper surface of the first island and electrically connected to the first bonding parts;
a second island;
a plurality of second leads each having a second bonding part near the second island; and
a second semiconductor chip which is on a rear surface of the second island and electrically connected to the second bonding parts, wherein
at least one of the second leads is between a pair of adjacent first leads,
a rear surface of the plurality of first leads and an upper surface of the plurality of second lead at least partially overlap each other, and
the first island, the second island, a part of the first leads and a part of the second leads are sealed by an insulating resin.

3. A semiconductor device comprising:
a first island;
a plurality of first leads each having one end near the first island;
a first semiconductor chip which is on an upper surface of the first island and electrically connected to the first leads;
a second island;
a plurality of second leads each having one end near the second island; and
a second semiconductor chip which is on a rear surface of the second island and electrically connected to the second leads, wherein
a rear surface of the first island and an upper surface of the second island at least partially overlap each other,
at least one of the second leads is between a pair of first leads, a rear surface of the plurality of first leads and an upper surface of the plurality of second leads at least partially overlap each other, and the first island, the second island, a part of the first leads and a part of the second leads are sealed by an insulating resin.

4. The semiconductor device according to claim 2, wherein the first island and the second island have a pair of sides opposite to each other, a first suspension lead integrated with the first island is on one of the sides of the first island, and the first bonding parts of the first leads are near the other side of the first island, and a second suspension lead integrated with the second island is on one of the sides of the second island, and the second bonding parts of the second leads are near the other side of the second island.

5. A semiconductor device comprising:

a first island;

first leads each having one end near the first island;

a first semiconductor chip which is fixed on an upper surface of the first island and electrically connected to the first leads;

a second island;

second leads each having one end near the second island; and a second semiconductor chip which is fixed on a lower surface of the second island and electrically connected to the second leads, wherein the first and second islands are at planarly different positions so as to be partially shifted from each other in a thickness direction and wherein the first and second islands at least partially overlap each other in the thickness direction.

6. The semiconductor device according to claim 5, wherein at least one of the first and second semiconductor chips planarly overlaps both of the first and second islands.

7. The semiconductor device according to claim 5, wherein both of the semiconductor chips, both of the islands and a part of both of the first and second leads are integrally sealed by an insulating resin, and both of the first and second leads include bonding parts to which both of the semiconductor chips are connected, connection parts exposed to an outside of the insulating resin on a same plane as a principal plane of the insulating resin, and continuous parts between the bonding parts and the connection parts.

8. The semiconductor device according to claim 5, wherein bonding pads on a surface of the first semiconductor chip are in a region overlapping the first island.

* * * * *